(12) United States Patent
Yajima

(10) Patent No.: US 8,106,460 B2
(45) Date of Patent: Jan. 31, 2012

(54) INSULATED GATE SEMICONDUCTOR DEVICE

(75) Inventor: Manabu Yajima, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 280 days.

(21) Appl. No.: 12/425,893

(22) Filed: Apr. 17, 2009

(65) Prior Publication Data

US 2009/0261418 A1 Oct. 22, 2009

(30) Foreign Application Priority Data

Apr. 21, 2008 (JP) ................. 2008-110507
Aug. 26, 2008 (JP) ................. 2008-217103
Dec. 22, 2008 (JP) ................. 2008-326093

(51) Int. Cl.
*H01L 27/06* (2006.01)

(52) U.S. Cl. .. 257/355; 257/173; 257/328; 257/E29.327

(58) Field of Classification Search .................. 257/355, 257/356, 357, 360, E27.016, 173, 328, E29.327
See application file for complete search history.

(56) References Cited

U.S. PATENT DOCUMENTS

| | | | |
|---|---|---|---|
| 3,712,995 A | 1/1973 | Steudel | |
| 5,012,313 A | 4/1991 | Fujihira | |
| 5,079,608 A | 1/1992 | Wodarczyk et al. | |
| 5,726,472 A | 3/1998 | Higashida | |
| 5,973,359 A | 10/1999 | Kobayashi et al. | |
| 6,211,551 B1 | 4/2001 | Suzumura et al. | |
| 6,249,023 B1 | 6/2001 | Finney | |
| 6,548,865 B2 | 4/2003 | Fujihira et al. | |
| 6,563,169 B1 | 5/2003 | Miyakoshi et al. | |
| 6,750,507 B2 | 6/2004 | Williams et al. | |
| 6,965,150 B2 | 11/2005 | Higashida et al. | |
| 7,026,668 B2 | 4/2006 | Hatakeyama et al. | |
| 7,045,856 B2 | 5/2006 | Hokomoto et al. | |
| 7,417,295 B2 | 8/2008 | Kushiyama et al. | |
| 7,651,917 B2 | 1/2010 | Kaneko | |
| 2001/0009287 A1 | 7/2001 | Fujihira et al. | |
| 2002/0050602 A1 | 5/2002 | Narazaki | |
| 2002/0088991 A1 | 7/2002 | Hisamoto | |
| 2002/0179945 A1 | 12/2002 | Sakamoto et al. | |

(Continued)

FOREIGN PATENT DOCUMENTS

CN 1794451 6/2006

(Continued)

OTHER PUBLICATIONS

Noguchi et al., U.S. Office Action mailed Mar. 19, 2010, directed to U.S. Appl. No. 11/860,206; 15 pages.

(Continued)

*Primary Examiner* — Evan Pert
*Assistant Examiner* — Selim Ahmed
(74) *Attorney, Agent, or Firm* — Morrison & Foerster LLP

(57) ABSTRACT

A protection diode group includes multiple protection diodes connected to each other in parallel. A total junction area average of the protection diode group is set to a value large enough to guarantee a desired electrostatic discharge tolerance. By setting the total junction area average to be equal to a junction area average of a conventional structure, the occupation area of the protection diode group on the chip is reduced while the ESD tolerance is made equal to a conventional ESD tolerance.

10 Claims, 20 Drawing Sheets

U.S. PATENT DOCUMENTS

| | | |
|---|---|---|
| 2002/0190285 A1 | 12/2002 | Sakamoto et al. |
| 2003/0006415 A1 | 1/2003 | Yokogawa et al. |
| 2003/0057497 A1 | 3/2003 | Higashida et al. |
| 2004/0206989 A1 | 10/2004 | Aida et al. |
| 2005/0082611 A1 | 4/2005 | Peake et al. |
| 2006/0071257 A1 | 4/2006 | Kang |
| 2006/0131645 A1 | 6/2006 | Kaneko |
| 2006/0255407 A1 | 11/2006 | Ishida |
| 2007/0034943 A1 | 2/2007 | Kushiyama et al. |
| 2007/0262390 A1 | 11/2007 | Ishida et al. |
| 2008/0061326 A1 | 3/2008 | Yoshida et al. |
| 2008/0079078 A1 | 4/2008 | Noguchi et al. |
| 2008/0079079 A1* | 4/2008 | Noguchi et al. ............. 257/355 |
| 2008/0142799 A1 | 6/2008 | Kaneko |
| 2009/0057757 A1 | 3/2009 | Hokomoto et al. |
| 2009/0078992 A1 | 3/2009 | Kaneko |
| 2010/0044749 A1 | 2/2010 | Kitamura et al. |
| 2010/0148268 A1 | 6/2010 | Noguchi et al. |

FOREIGN PATENT DOCUMENTS

| | | |
|---|---|---|
| JP | 1-280359 | 11/1989 |
| JP | 3-71673 | 3/1991 |
| JP | 2002-043574 | 2/2002 |
| JP | 2002-368218 | 12/2002 |

OTHER PUBLICATIONS

Noguchi, Y. et al., U.S. Office Action mailed Mar. 5, 2009, directed to U.S. Appl. No. 11/860,689; 10 pages.

Noguchi, Y. et al., U.S. Office Action mailed Sep. 15, 2009, directed to U.S. Appl. No. 11/860,689; 12 pages.

Noguchi, Y. et al., U.S. Office Action mailed Mar. 6, 2009, directed to U.S. Appl. No. 11/860,206; 12 pages.

Noguchi, Y. et al., U.S. Office Action mailed Sep. 10, 2009, directed to U.S. Appl. No. 11/860,206; 17 pages.

* cited by examiner

FIG.5A

| PROTECTION DIODE (ONE) | | | |
|---|---|---|---|
| JUNCTION INTERFACE | RADIUS [$\mu$m] | CIRCUMFERENTIAL LENGTH [$\mu$m] | JUNCTION AREA [$\mu$m$^2$] |
| J11 | 75.5 | 474 | 332 |
| J12 | 89.5 | 562 | 393 |
| J13 | 92.5 | 581 | 407 |
| J14 | 106.5 | 669 | 468 |

FIG.5B

| PROTECTION DIODE GROUP | | | |
|---|---|---|---|
| JUNCTION INTERFACE | CIRCUMFERENTIAL LENGTH [$\mu$m] | TOTAL JUNCTION AREA [$\mu$m$^2$] | |
| 1st annular portion | 1897 | J1 | 1328 |
| 2nd annular portion | 2248 | J2 | 1574 |
| 3rd annular portion | 2324 | J3 | 1627 |
| 4th annular portion | 2675 | J4 | 1873 |
| TOTAL JUNCTION AREA AVERAGE J | | | 1600 |

FIG.6

| PROTECTION DIODE (CONVENTIONAL) | | | |
|---|---|---|---|
| JUNCTION INTERFACE | RADIUS [μm] | CIRCUMFERENTIAL LENGTH [μm] | JUNCTION AREA [μm$^2$] |
| j11 | 348.5 | 2189 | 1532 |
| j12 | 362.5 | 2277 | 1594 |
| j13 | 365.5 | 2295 | 1607 |
| j14 | 379.5 | 2383 | 1668 |
| JUNCTION AREA AVERAGE j | | | 1600 |

FIG.8

| CHIP SIZE | | | CONVENTIONAL STRUCTURE | | | STRUCTURE IN PRESENT EMBODIMENT | | | EFFECT OF REDUCING ON-STATE RESISTANCE |
| --- | --- | --- | --- | --- | --- | --- | --- | --- | --- |
| X [mm] | Y [mm] | CHIP AREA [mm$^2$] | PROTECTION DIODE AREA [mm$^2$] | AREA OF THE OPERATING REGION [mm$^2$] | ON-STATE RESISTANCE [mΩ] | PROTECTION DIODE GROUP AREA [mm$^2$] | AREA OF THE OPERATING REGION [mm$^2$] | ON-STATE RESISTANCE [mΩ] | |
| 1.0 | 1.0 | 1.00 | 0.576 | 0.42 | 23.58 | 0.184 | 0.82 | 12.3 | 52% |
| 1.1 | 1.1 | 1.21 | 0.576 | 0.63 | 15.77 | 0.184 | 1.03 | 9.7 | 62% |
| 1.2 | 1.2 | 1.44 | 0.576 | 0.86 | 11.57 | 0.184 | 1.26 | 8.0 | 69% |
| 1.3 | 1.3 | 1.69 | 0.576 | 1.11 | 8.98 | 0.184 | 1.51 | 6.6 | 74% |
| 1.4 | 1.4 | 1.96 | 0.576 | 1.38 | 7.23 | 0.184 | 1.78 | 5.6 | 78% |
| 1.5 | 1.5 | 2.25 | 0.576 | 1.67 | 5.97 | 0.184 | 2.07 | 4.8 | 81% |
| 1.6 | 1.6 | 2.56 | 0.576 | 1.98 | 5.04 | 0.184 | 2.38 | 4.2 | 84% |
| 1.7 | 1.7 | 2.89 | 0.576 | 2.31 | 4.32 | 0.184 | 2.71 | 3.7 | 86% |
| 1.8 | 1.8 | 3.24 | 0.576 | 2.66 | 3.75 | 0.184 | 3.06 | 3.3 | 87% |
| 1.9 | 1.9 | 3.61 | 0.576 | 3.03 | 3.30 | 0.184 | 3.43 | 2.9 | 89% |
| 2.0 | 2.0 | 4.00 | 0.576 | 3.42 | 2.92 | 0.184 | 3.82 | 2.6 | 90% |

| PROTECTION DIODE (ONE) | | | | PROTECTION DIODE GROUP | | | |
|---|---|---|---|---|---|---|---|
| JUNCTION INTERFACE | ONE SIDE [μm] | CIRCUM-FERENTIAL LENGTH [μm] | JUNCTION AREA [μm²] | JUNCTION INTERFACE | CIRCUM-FERENTIAL LENGTH [μm] | TOTAL JUNCTION AREA [μm²] | |
| J11 | 111.9 | 447.6 | 313.32 | 1st annular portion | 1790.4 | J1 | 1253.28 |
| J12 | 139.9 | 559.6 | 391.72 | 2nd annular portion | 2238.4 | J2 | 1566.88 |
| J13 | 145.9 | 583.6 | 408.52 | 3rd annular portion | 2234.4 | J3 | 1634.08 |
| J14 | 173.9 | 695.6 | 486.92 | 4th annular portion | 2782.4 | J4 | 1947.68 |
| | | | | TOTAL JUNCTION AREA AVERAGE | | J | 1600 |

| JUNCTION INTERFACE | ONE SIDE [μm] | CIRCUMFERENTIAL LENGTH [μm] | JUNCTION AREA [μm²] |
|---|---|---|---|
| j11 | 540.5 | 2162 | 1513.4 |
| j12 | 568.5 | 2274 | 1591.8 |
| j13 | 574.5 | 2298 | 1608.6 |
| j14 | 602.5 | 2410 | 1687 |
| JUNCTION AREA AVERAGE j | | | 1600 |

Prior Art

INSULATED GATE SEMICONDUCTOR DEVICE

This application claims priority from Japanese Patent Application Number JP 2008-110507 filed on Apr. 21, 2008, JP 2008-217103 filed on Aug. 26, 2008, and JP 2008-326093 filed on Dec. 22, 2008, the contents of which are incorporated herein by reference in their entirety.

BACKGROUND OF THE INVENTION

1. Field of the Invention

The present invention relates to an insulated gate semiconductor device, and particularly to an insulated gate semiconductor device having an improved electrostatic discharge tolerance.

2. Description of the Related Art

In a conventional insulated gate semiconductor device (for example, a metal oxide semiconductor field effect transistor (MOSFET)), a protection diode is connected between a gate electrode and a source electrode and a protection resistor is connected to the gate electrode, in order to protect a thin gate insulating film (oxide film) against electrostatic discharge (hereinafter, ESD).

FIG. 20 is a plan view showing a conventional MOSFET. A large number of MOSFET cells 36 are disposed in an operating region 35. Gate electrodes of the cells 36 are drawn out to the outside of the operating region 35 through a gate connection electrode 34, and are connected to a gate pad electrode 31. A protection diode 32 and a MOSFET 50 are integrated on the same chip.

The protection diode 32 is disposed under the gate pad electrode 31. The protection diode 32 is a bidirectional Zener diode formed of multiple pn junction diodes connected to each other. One end of the protection diode 32 is connected to a source electrode (unillustrated) that covers all the cells 36, while the other end is connected to the gate pad electrode 31. This technology is described for instance in Japanese Patent Application Publication No. 2002-43574.

The conventional protection diode 32 has a single circle shape in which the multiple circular pn junctions having different distances (radii) from the center are concentrically formed. The protection diode 32 having approximately the same size (area) as the gate pad electrode 31 is disposed under the gate pad electrode 31.

One of known methods of increasing the ESD tolerance of MOSFET is to increase the total area of pn junctions constituting the protection diode. However, the increase in the partial or total junction area of the concentrically formed multiple pn junctions increases the area occupied by the protection diode on the chip.

Accordingly, as compared with a normal chip in the same size without its junction area being increased, the chip with its junction area increased has a small the operating region and therefore has high on-state resistance of the MOSFET. On the other hand, when the chip with its junction area increased is formed with the same area for the operation region as the normal chip, the chip size is increased.

SUMMARY OF THE INVENTION

The invention provides an insulated gate semiconductor device that includes a semiconductor substrate, a plurality of transistor cells of an insulated gate semiconductor element formed in the semiconductor substrate so as to define an operating region in the semiconductor substrate, a gate pad electrode disposed on the semiconductor substrate and connected to gate electrodes of the transistor cells, and a group of protection diodes disposed on the semiconductor substrate outside the operating region. The group of protection diodes includes a first protection diode and a second protection diode that are connected to each other in parallel, and each of the first and second protection diodes has a plurality of pn junctions formed between a p type semiconductor region and an n type semiconductor region.

BRIEF DESCRIPTION OF THE DRAWINGS

FIGS. 5A and 5B show design values for the insulated gate semiconductor device of this embodiment.

FIG. 6 shows design values for a protection diode having the conventional structure.

FIG. 8 is a table for comparing characteristics of the insulated gate semiconductor device of this embodiment with those having the conventional structure.

DESCRIPTION OF THE INVENTIONS

Preferred embodiments of the invention will be described with reference to FIGS. 1 to 19, exemplifying a case where transistor cells of a MOSFET are provided on an operating region.

Figure 1:
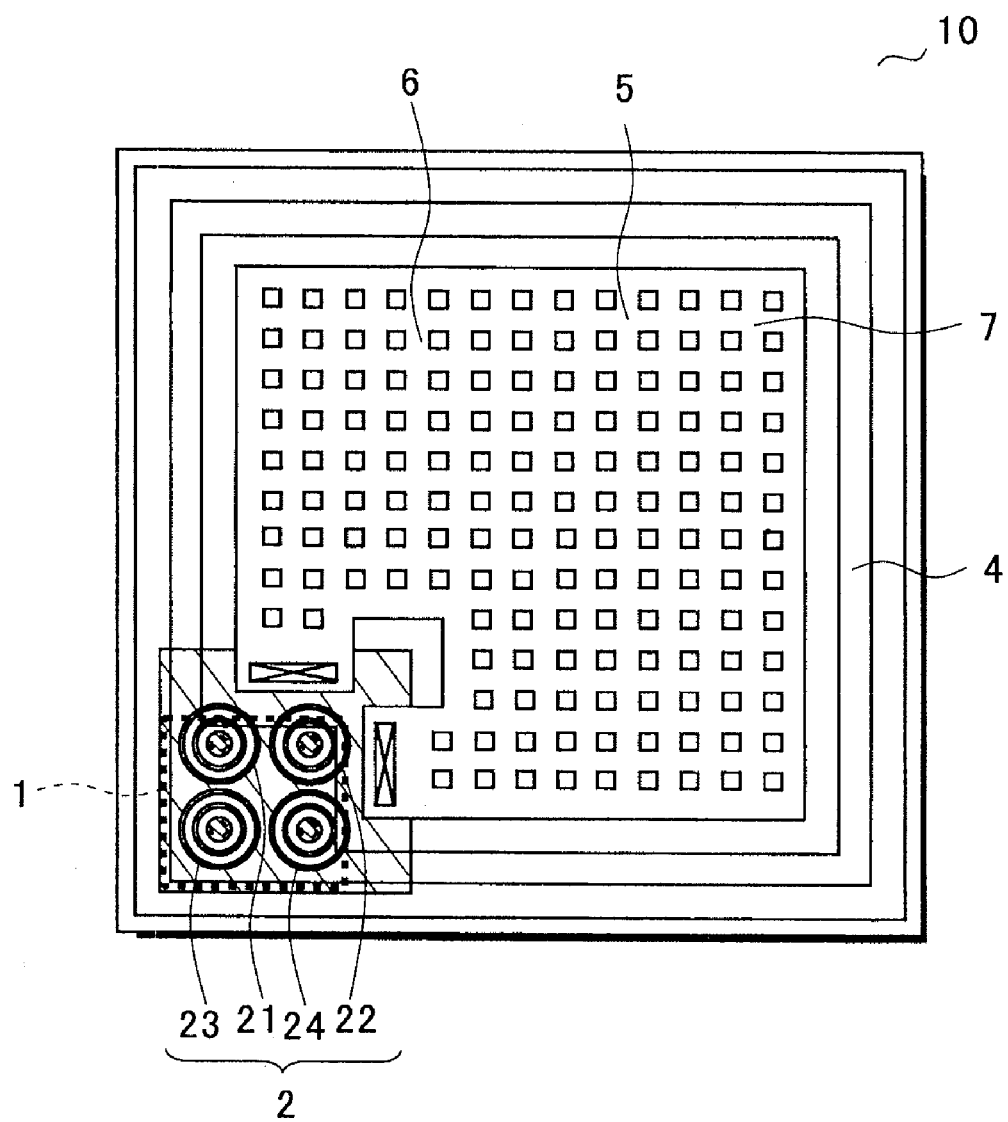
FIG. 1 is a plan view for describing an insulated gate semiconductor device according to a first preferred embodiment of the invention.

First of all, a first embodiment will be described with reference to FIGS. 1 to 8. FIG. 1 is a plan view showing a MOSFET of this embodiment.

A MOSFET 10 includes a gate pad electrode 1, a protection diode group 2, and an operating region 5.

A large number of MOS transistor cells 6 are disposed in the operating region 5. Hereinafter, the operating region 5 is referred to as a region where the MOS transistor cells 6 are disposed. The gate pad electrode 1 is disposed, for example, outside the operating region 5, and is connected to gate electrodes of the respective MOS transistor cells 6 through a gate connection electrode 4 disposed around the operating region 5.

Since the MOS transistor cell 6 of the operating region 5 has a known structure, the illustration is omitted. Nevertheless, the MOS transistor cell 6 may be structured as follows, for example. An n− type semiconductor layer is stacked on an n+ type semiconductor substrate so as to serve as a drain region. A p type channel layer is provided on the surface of the n type semiconductor layer. Trenches are formed and penetrate the channel layer. The inner wall of each of the trenches is coated with a gate insulating film (oxide film), and the gate electrode is buried in the trench. N+ type source regions are formed in the surface areas, of the channel layer, adjacent to the trenches. P+ body regions are formed between the source regions in the surface area of the channel layer. Here, the gate electrodes (trenches) are provided in a grid pattern, and a region surrounded by the gate electrodes serves as the MOS transistor cell 6. The surface of the gate electrode is covered with an interlayer insulating film, and a source electrode 7 is provided thereon.

The protection diode group 2 and the MOS transistor cells 6 are integrated on the same chip, and the protection diode group 2 is disposed under the gate pad electrode 1. The protection diode group 2 is an assembly of multiple protection diodes having identical shapes. Herein, the protection diode group 2 includes, for example, four protection diodes 21, 22, 23, 24. To put it differently, the four protection diodes 21 to 24 are disposed under the single gate pad electrode 1, and these are connected to each other in parallel.

Here, in FIG. 1, the gate pad electrode 1 and the gate connection electrode 4 are continuous and formed of the same metal layer. However, a rectangular region, indicated by a dashed line, on the protection diode group 2 is the gate pad electrode 1.

The protection diode group 2 is connected between the source and the gate of the MOSFET 10, and protects a gate oxide film against static electricity from outside and overvoltage during the operation.

Figure 2A:
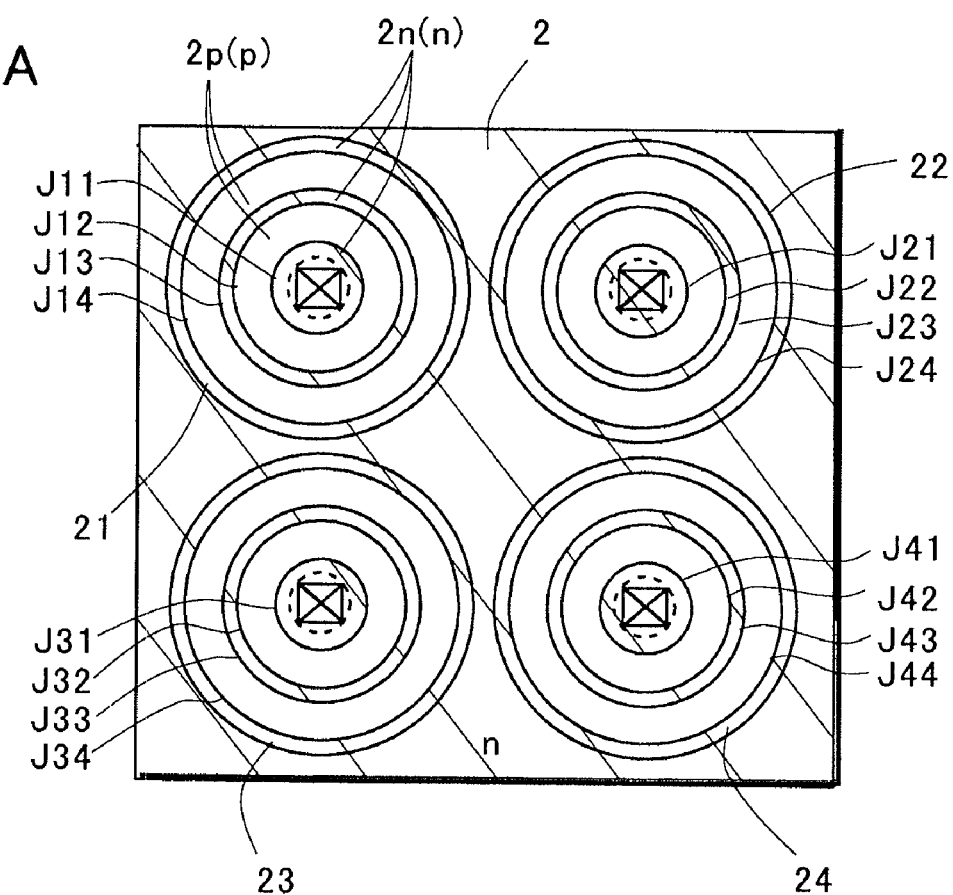
FIGS. 2A and 2B are plan views for describing the insulated gate semiconductor device of this embodiment.
Figure 2B:
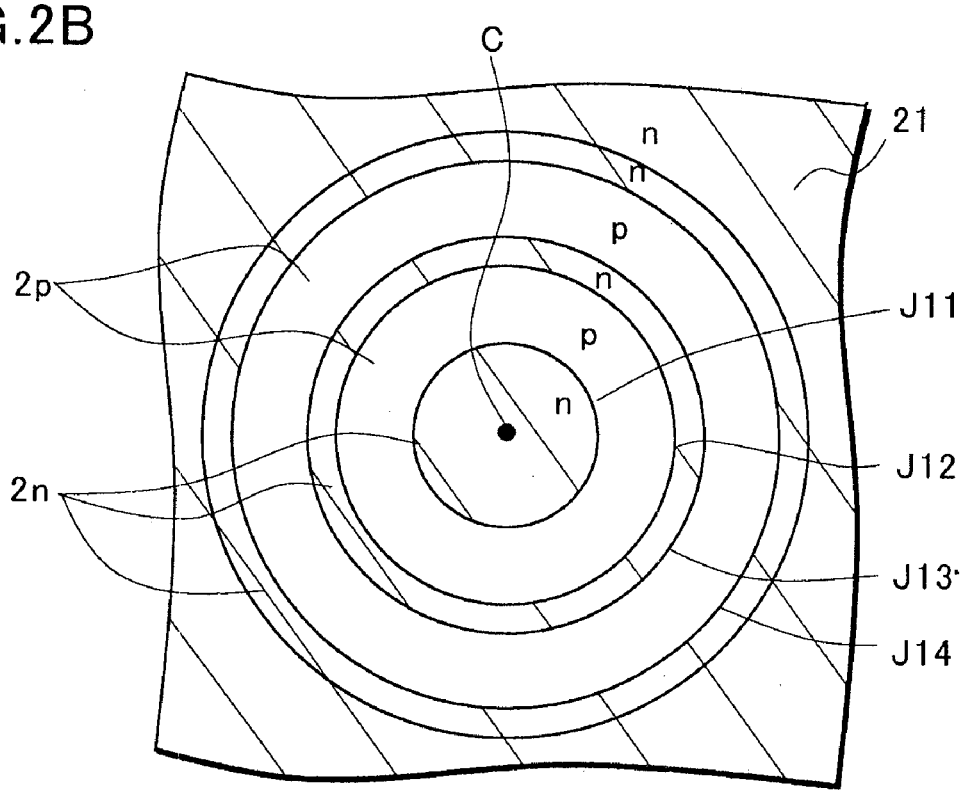

The protection diode group 2 will be described with reference to FIGS. 2A and 2B. FIG. 2A is a plan view of the protection diode group 2. FIG. 2B is a plan view of the single protection diode.

As shown in FIG. 2A, the gate pad electrode 1 is provided to cover at least, for example, n type semiconductor regions 2n that are innermost annular portions of the four protection diodes 21 to 24 and comes into contact with the n type semiconductor regions 2n. Moreover, the four protection diodes 21 to 24 share their outermost annular portions, here, n type semiconductor regions 2n. In other words, the n type impurity regions 2n that are the outermost annular portions of the respective protection diodes 21 to 24 are continuous, and the external shape is formed to be rectangular, for example. In other words, the four outermost rings 2n, which are made of the n type semiconductor, are connected with the same n type semiconductor.

Two sides of the rectangular n type impurity regions 2n are connected to the source electrode 7 of the MOSFET 10 (see FIG. 1). Thereby, the four protection diodes 21 to 24 are connected to each other in parallel.

Since all the four protection diodes 21 to 24 have the identical shapes, description will be given of one of the protection diodes 21 to 24, i.e., the protection diode 21, with reference to FIG. 2B.

The protection diode 21 is formed as follows. Polysilicon is deposited on the surface of the substrate constituting the chip so as to have, for example, a rectangular outer shape. Then, n type and p type impurities are diffused in the polysilicon layer so that the n type semiconductor regions 2n and the p type semiconductor regions 2p are alternately and concentrically disposed. Thus, multiple (a number, N) pn junctions are formed. An example of the shape of a pn junction interface of the protection diode 21 is an annular portion. The protection diode 21 has four pn junctions (N=4). In other words, four annular pn junction interfaces (annular portions) J11 to J14 having different diameters are formed concentrically. A closed loop shape is employed for the pn junction so that there are no junction ends exposed to the polysilicon, and thereby a leak current is suppressed.

Similarly, the protection diode 22 has four concentric pn junction interfaces J21 to J24; the protection diode 23 has four concentric pn junction interfaces J31 to J34; and the protection diode 24 has four concentric pn junction interfaces J41 to J44.

In this embodiment, the total junction area average of the four protection diodes 21 to 24 is set at a value large enough to guarantee a desired ESD tolerance. The total junction area average is obtained as follows. Firstly, the junction areas of pn junction interfaces in the four protection diodes 21 to 24 are summed up for each of the first to Nth pn junction interfaces. Thus, the junction area (hereinafter, total junction area) for each of the 1st to Nth junction interfaces is obtained. Then, the average value is calculated from these obtained total junction areas of the four pn junction interfaces.

Herein, the junction area is referred to as the product of the length (circumference) and the thickness of the polysilicon (for example, 7000 Å) of one pn junction interface (for example, the pn junction interface J11).

Specifically, first, the junction areas of the pn junctions to which equal potentials are applied in the protection diodes 21 to 24 are summed. More specifically, the following total junction areas are calculated: a first total junction area J1 that is a sum of the pn junction areas of the pn junction interfaces J11, J21, J31, J41 closest to centers C; a second total junction area J2 that is a sum of the pn junction areas of the second closest pn junction interfaces J12, J22, J32, J42; a third total junction area J3 that is a sum of the pn junction areas of the third closest pn junction interfaces J13, J23, J33, J43; and a fourth total junction area J4 that is a sum of the pn junction areas of the fourth closest pn junction interfaces J14, J24, J34, J44. Then, a total junction area average J of the total junction areas J1 to J4 (i.e., J=(J1+J2+J3+J4)/4) is set at a value large enough to guarantee the desired ESD tolerance.

Figure 20:
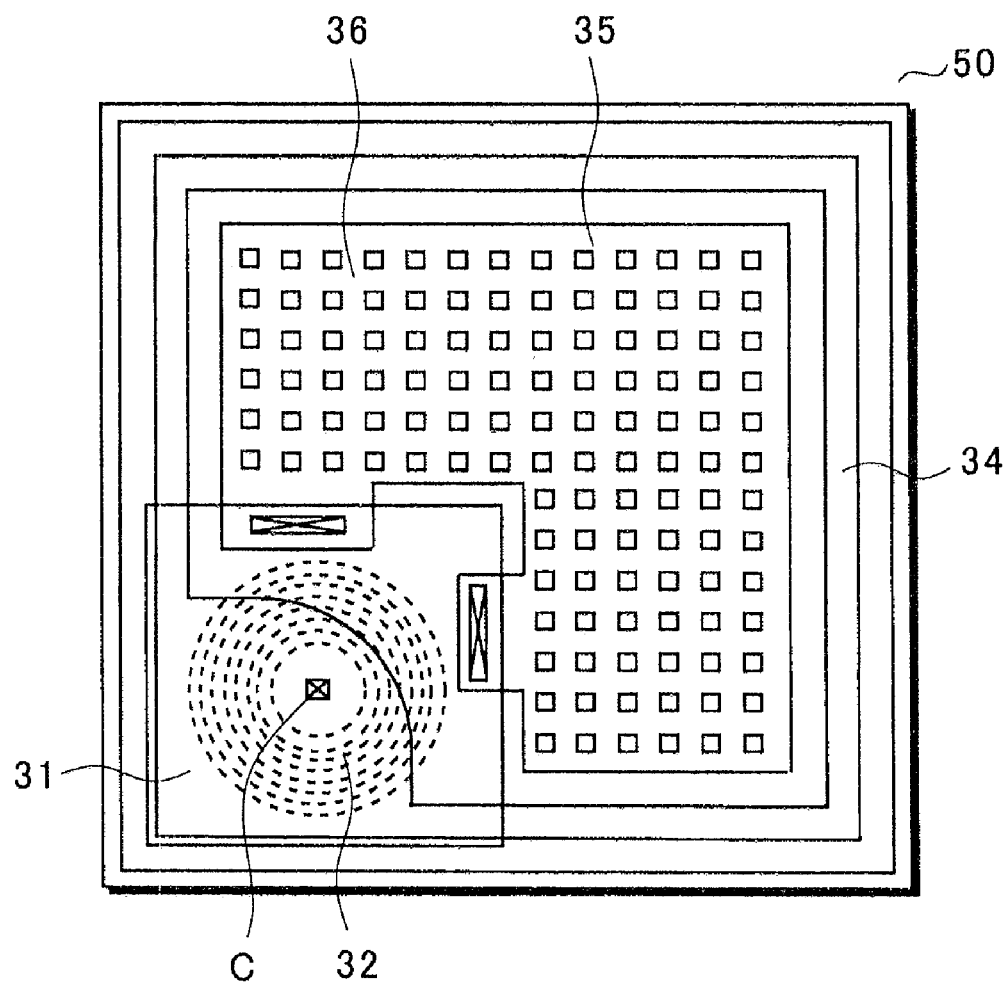
FIG. 20 is a plan view for describing a conventional insulated gate semiconductor device.

The total junction area average J is set to be equal to a junction area average j of the conventional single protection diode 32 (see FIG. 20). Thereby, the occupation area of the protection diode group 2 on the chip is reduced while the characteristics equal to those of the protection diode 32 of the conventional structure are maintained. Herein, the junction area average in the conventional structure is an average value of the respective junction areas of the multiple pn junction interfaces.

This point will be described hereinbelow.

Figure 3A:
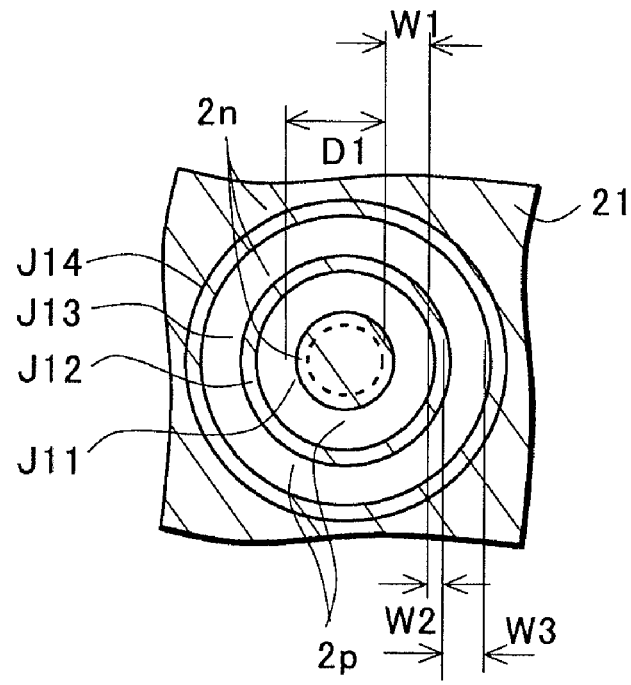
FIGS. 3A and 3B are plan views for comparing the insulated gate semiconductor device of this embodiment with that having a conventional structure.
Figure 3B:
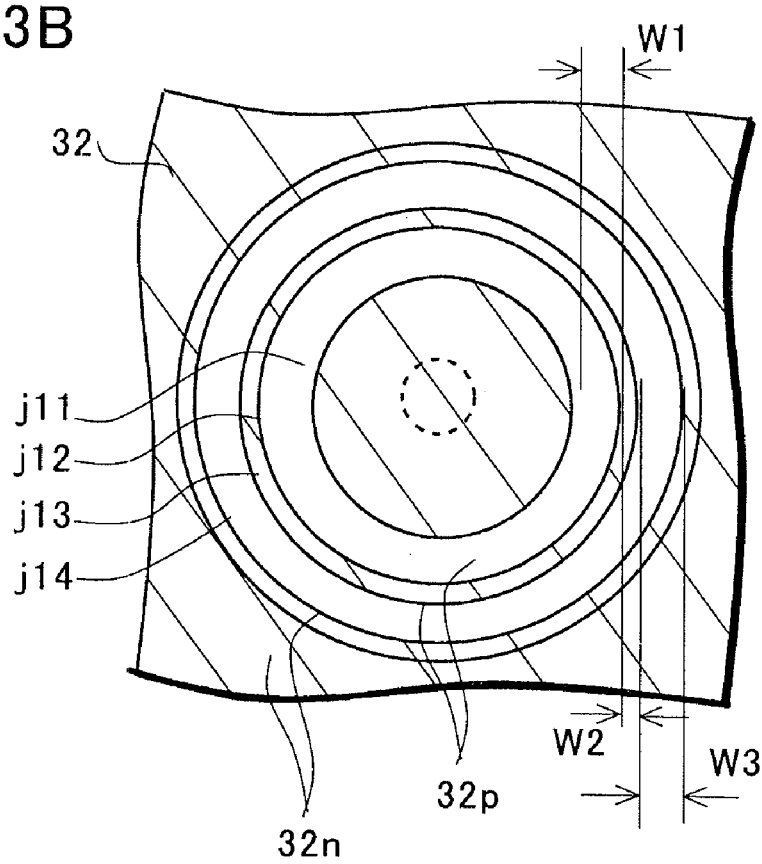

FIG. 3A is a plan view showing the protection diode 21 that is one in the protection diode group 2 of this embodiment. FIG. 3B is a plan view showing the conventional protection diode 32.

In the protection diode 21, the n type semiconductor region 2n located in the center has a diameter D1 of, for example, 151 μm. Moreover, a p type semiconductor region 2p between the pn junction interface J11 closest to the center and the second closest pn junction interface J12 has a width W1 of 14 μm. An n type semiconductor region 2n between the second closest pn junction interface J12 and the third closest pn junction interface J13 has a width W2 of 3 μm. A p type semiconductor region 2p between the third closest pn junction interface J13 and the fourth closest pn junction interface J14 has a width W3 of 14 μm.

The outermost n type semiconductor region 2n is shared with the other protection diodes 22 to 24. Although the outermost n type semiconductor regions 2n of the protection diodes 21 to 24 are indicated by annular solid lines for convenience in this embodiment, these regions are continuous with an n type semiconductor region 2n among the protection diodes 21 to 24.

Moreover, the width W2 of the outermost n type semiconductor region 2n is ensured to be equal to the width of the n type semiconductor region 2n between the pn junction interface J12 and the pn junction interface J13. Note that the width W2 of the outermost n type semiconductor region 2n may overlap the adjacent protection diode.

Moreover, the n type semiconductor regions 2n have an impurity concentration of, for example, approximately 1E19 $cm^{-3}$ and the p type semiconductor regions 2p have an impurity concentration of, for example, approximately 1E17 $em^{-3}$.

Herein the conventional protection diode 32 has the breakdown voltage, leak current characteristic, and the like in addition to the ESD tolerance, which are all equal to those of the protection diode 21 of this embodiment.

Specifically, as shown in FIG. 3B, the protection diode 32 includes four pn junction interfaces j11 to j14. The width W1 of a p type semiconductor region 32p between the pn junction interface j11 and the pn junction interface j12, the width W2 of an n type semiconductor region 32n between the pn junction interface j12 and the pn junction interface j13, and the width W3 of a semiconductor region 32p between the pn junction interface j13 and the pn junction interface j14 are equal to those of the protection diode 21. Moreover, the n type semiconductor region 32n and the p type semiconductor regions 32p have impurity concentrations equal to those of the protection diode 21.

In the protection diodes 21 to 24 of this embodiment, the area of the n type semiconductor region 2n which is located in the center, and which comes into contact with the gate pad electrode 1, is reduced. The widths of the other n type semiconductor regions 2n and the p type semiconductor regions 2p are equal to those of the conventional protection diode 32.

The ESD tolerance of a protection diode is determined by the allowable power [W], and the allowable power correlates with the pn junction capacitance. Specifically, the ESD tolerance depends on the junction area average or the total junction area average of the protection diode.

Note that, in comparison between the total junction area average of this embodiment and the junction area average of the conventional structure, the method of calculating the average of the first to fourth junction areas which are different from each other, and to which different potentials are applied, is the same in both cases. As a premise thereof, in this embodiment, the pn junction interfaces (Nth annular portions corresponding to one another), to which the same potential is applied, of the four protection diodes are summed in advance.

Figure 4:
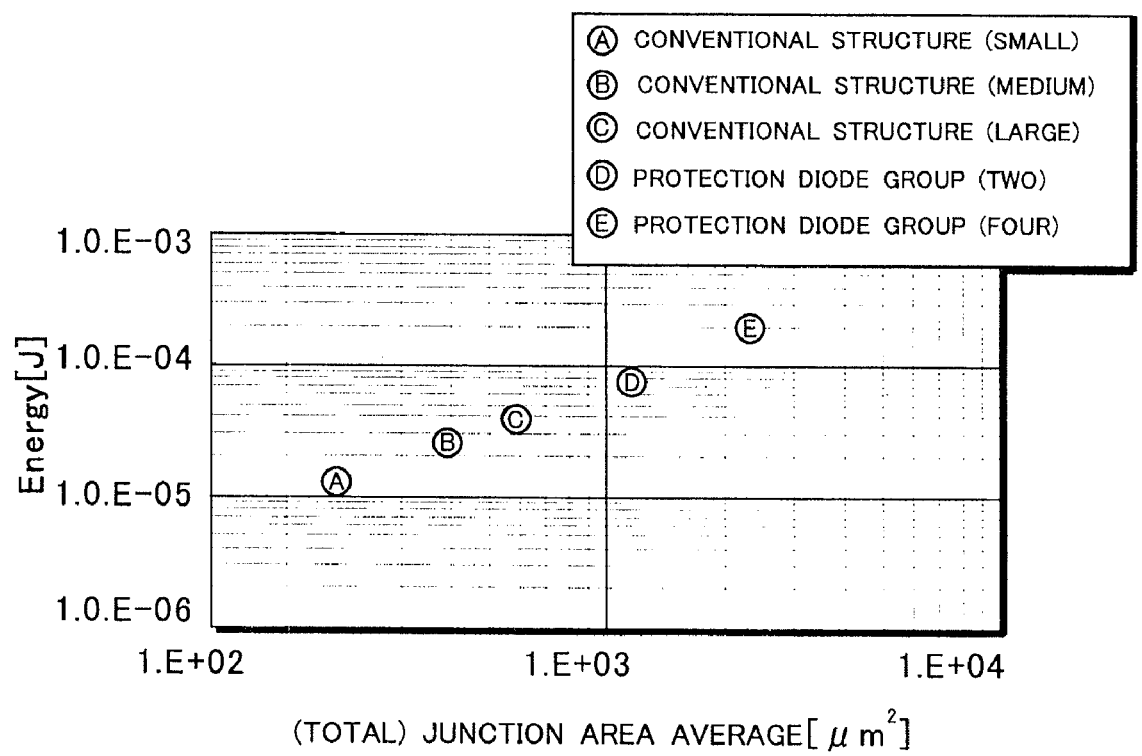
FIG. 4 is a characteristic diagram for describing the insulated gate semiconductor device of this embodiment.

FIG. 4 shows the relation between the ESD tolerance and the junction area average or total junction area average.

The X axis indicates the (total) junction area average [$μm^2$], and the Y axis indicates the energy [J] converted from ESD tolerance. Plotted points A, B and C are measured values of junction area average of three types of the protection diodes 32 having the conventional structure. The protection diodes 32 are different in size (small, medium, large), and the size is here referred to as a radius between the center and the outermost periphery. Meanwhile, points D and E are measured values of total junction area averages of the protection diode groups 2 of this embodiment. The point D is obtained in a case where the two protection diodes are connected in parallel. The point E is obtained in a case where the four protection diodes are connected in parallel.

In the protection diodes 32 and the protection diode groups 2, the manufacturing conditions and the widths W1 to W3 of all the p type semiconductor regions (for example, the p type semiconductor region 2p) and the n type semiconductor regions (for example, the n type semiconductor region 2n) are the same, and the number N of pn junctions is four.

As apparent from this result, the larger the (total) junction area average, the greater the ESD tolerance. Moreover, the protection diodes (protection diode groups) having the same (total) junction area averages demonstrate the same ESD tolerances.

In the protection diodes (protection diode groups) having the same (total) junction area averages, even if the number of pn junctions constituting, for example, a single protection diode (group) is different from each other, the same ESD tolerances can be obtained. Moreover, even if the size of the protection diode (group) is different from each other, the same ESD tolerances can be obtained.

Thus, in this embodiment, the single protection diode conventionally provided under the gate pad electrode is divided into multiple (for example, four) protection diodes, and the protection diodes are connected in parallel to form the protection diode group 2. The average value of the total junction areas of the protection diode group 2 is designed so that the desired ESD tolerance can be guaranteed. In this configuration, when the value of the junction area average is made equal to that of the conventional protection diode (equal ESD tolerance), the occupation area of the protection diode group 2 can be reduced.

FIGS. 5A to 6 are tables showing one example of a case where the pn junction interfaces are designed so that the total junction area average of the protection diode group 2 of this embodiment can be equal to the junction area average of the conventional protection diode 32.

FIGS. 5A and 5B show design values for the protection diode 21 (FIGS. 2B and 3A) and the protection diode group 2 (FIG. 2A) of this embodiment, respectively. FIG. 6 shows design values for the protection diode having the conventional structure (FIG. 3B).

FIG. 5A shows distances (radii) from the center C (see FIG. 2B), circumferential lengths, and junction areas, of the respective pn junction interfaces J11 to J14 of the single protection diode 21. Note that, the protection diodes 22 to 24 have the same values as the protection diode 21.

Meanwhile, FIG. 5B shows: the total circumferential length obtained by summing, from the first to fourth almular portion in order, the circumferential lengths of the annular portions corresponding to each other in the protection diodes 21 to 24; values of the first total junction area J1 to the fourth total junction area J4; and a value of the total junction area average J.

By forming the protection diode group 2 under the conditions shown in FIG. 5A, the total junction area average J of the protection diode group 2 is 1600 $μm^2$ as shown in FIG. 5B.

FIG. 6 shows distances (radii) from the center C, circumferential lengths, and junction areas, of the respective junction interface j11 to j14 of the conventional protection diode 32 having the same characteristics. The junction area average j of the pn junction interfaces j11 to j14 is 1600 μm² as similar to the protection diode group 2.

Figure 7A:
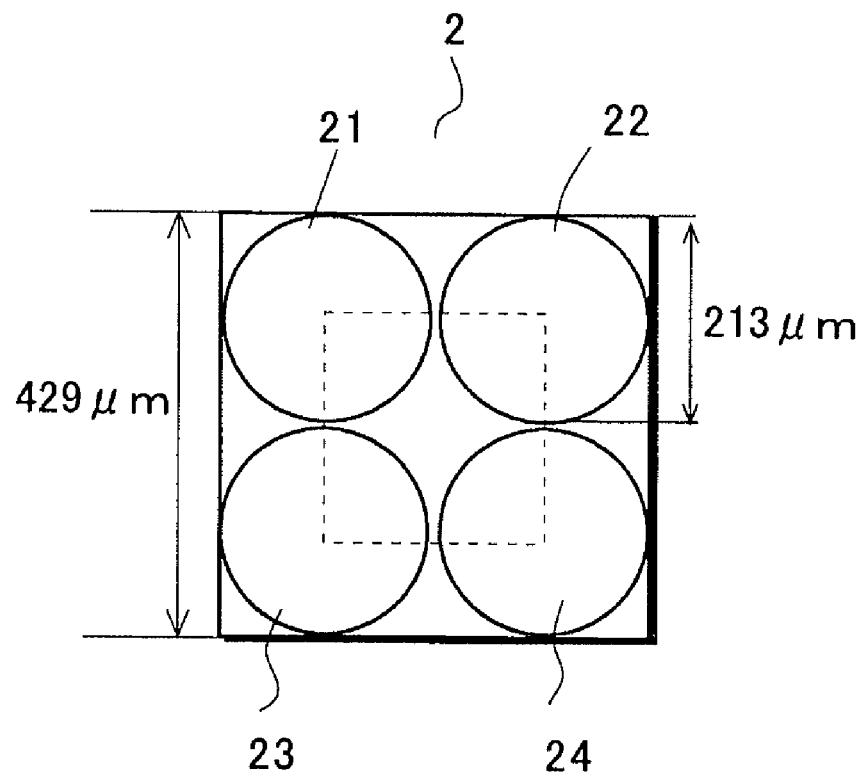
FIGS. 7A and 7B are plan views for comparing the insulated gate semiconductor device of this embodiment with that having the conventional structure.
Figure 7B:
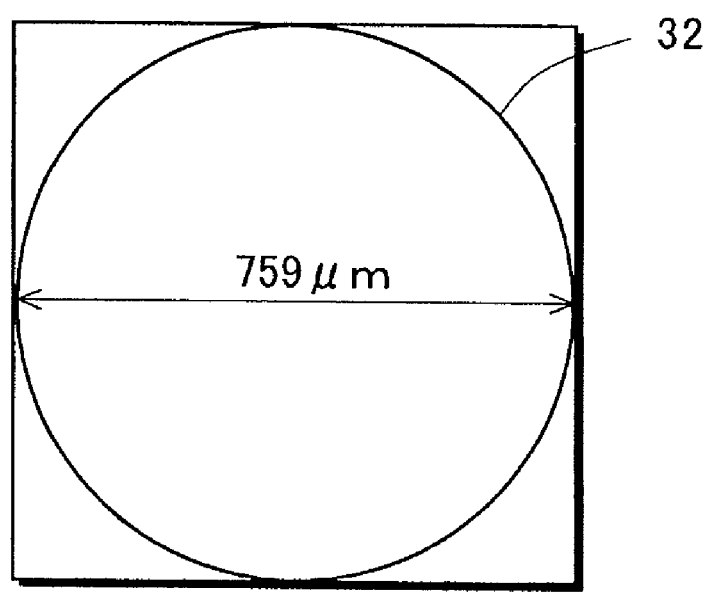

FIGS. 7A and 7B show the occupation area of the protection diode group 2. FIG. 7A is a plan view in a case where the protection diode group 2 is formed based on the values shown in FIGS. 5A and 5B. FIG. 7B is a plan view in a case where the conventional protection diode 32 is formed based on the values shown in FIG. 6.

Incidentally, annular portions in FIGS. 7A and 7B respectively indicate the shapes of the outermost annular portions of the protection diodes 21 to 24 and the conventional protection diode 32.

When the protection diodes 21 to 24 and the protection diode group 2 are formed based on the values shown in FIGS. 5A and 5B, the diameters of the protection diodes 21 to 24 are each 213 μm, the occupation area of the protection diode group 2 is 429 μm×429 μm (FIG. 7A). By contrast, the occupation area of the protection diode 32 having the conventional structure is 759 μm×759 μm (FIG. 7B).

In this embodiment, the protection diode is divided into the multiple protection diodes 21 to 24. Thereby, the junction area is increased by a region where the protection diodes 21 to 24 come close to each other, the region being surrounded by a dashed line. Thus, when the value of the total junction area average is made equal to the junction area average of the conventional protection diode 32, the occupation area of the protection diode group 2 can be reduced by 68%.

As the area of the protection diode group 2 is reduced, the area of the operating region 5 of the MOSFET 10 (see FIG. 1) can be increased by that area, and the effect of reducing the on-state resistance is exerted in a chip of the same size. Moreover, when the area of the operating region 5 is kept the same, the chip size can be reduced.

FIG. 8 is a table in which the occupation area of the conventional protection diode 32, the area of the operating region 35 and the on-state resistance of the chip are compared with the occupation area of the protection diode group 2 of this embodiment, the area of the operating region 5 and the on-state resistance of the chip and then the effect of reducing the on-state resistance is calculated.

Here, the on-state resistance is calculated with an on-state resistance Rds (on) per unit area; that is, Rds (on)·A (A is the area of the operating region) being 10 mΩ·mm². Moreover, although the gate connection electrode 4 or the like is actually disposed at the outer periphery of the operating region 5, the calculation is performed on the assumption that the operating region 5 reaches the end portion of the chip.

In this manner, this embodiment makes it possible to reduce the on-state resistance of any chip size. Moreover, in this embodiment, it is found that the smaller the chip size, the higher the effect of reducing the on-state resistance (because this leads to the increase in the proportion of the occupation area of the protection diode group 2 to the chip area).

Figures 9A, 9B:
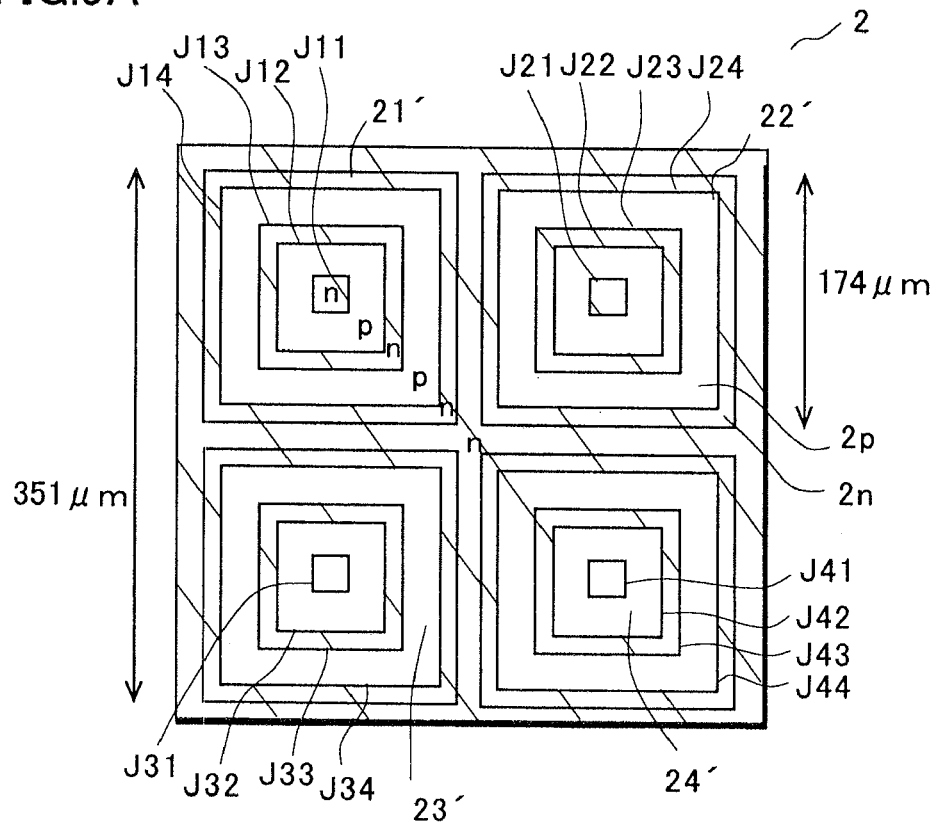
FIG. 9A is a plan view.
FIG. 9B is a list of design values, for describing a second preferred embodiment of the invention.

A second embodiment of the present invention will be described with reference to FIGS. 9A to 10B. FIG. 9A is a plan view showing a protection diode group 2 of the second embodiment. FIG. 9B is one example of design values for protection diodes 21' to 24' and the protection diode group 2. Note that, although FIG. 9B shows the design values for only the protection diode 21', the protection diodes 22' to 24' also have the same values.

Figures 10A, 10B:
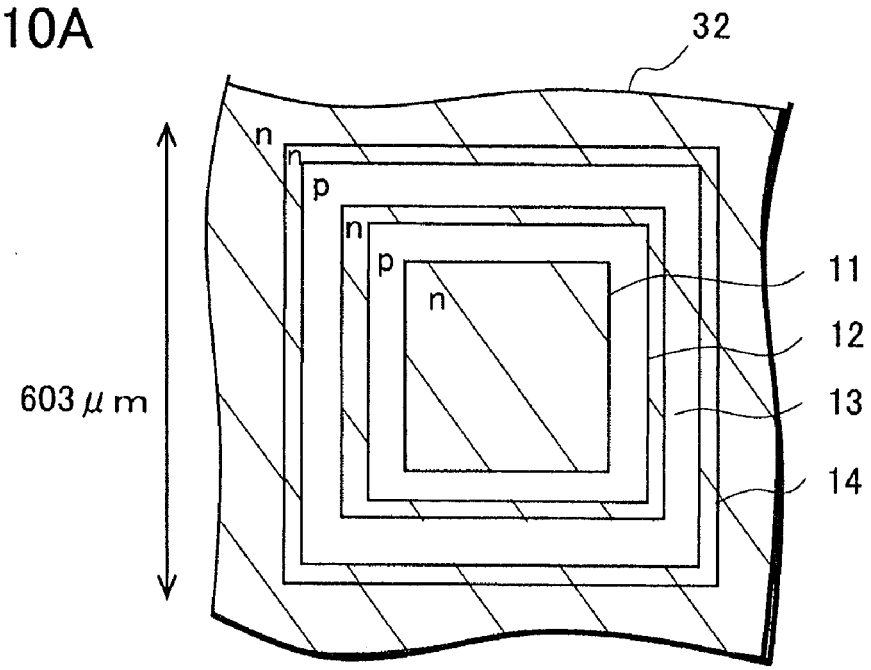
FIG. 10A is a plan view.
FIG. 10B is a list of design values, for describing another conventional mode.

FIG. 10A is a plan view of a rectangular single protection diode 32 having the same junction area average as the total junction area average of the protection diode group 2 in FIG. 9A for comparison, and FIG. 10B shows design values of the protection diode 32.

As shown in FIG. 9A, the protection diode group 2 includes: the protection diode 21' having rectangular pn junction interfaces J11 to J14 that are disposed in a concentric form; and the protection diodes 22' to 24' having the same patterns as the protection diode 21'. Here, the concentric form means that the centers of respective pn junction interfaces having the similar shapes are located in the same position.

By forming the protection diodes 21' to 24' into a rectangular shape, the dead space among the protection diodes 21' to 24' is eliminated. Thus, the occupation area of the protection diode group 2 is further reduced.

For example, the protection diode 21' is formed as follows. Each side of an n type semiconductor region 2n located in the center is 112 μm. The widths of the other n type semiconductor regions 2n and p type semiconductor regions 2p are equal to the respective widths W2 and W3 shown in FIG. 3A. The pn junction interfaces J11 to J14 are designed by using the values shown in FIG. 9B. Thereby, total junction areas J1 to J4 of the respective junction interfaces of the four protection diodes 21' to 24' are set at the values shown in the FIG. 9B, and thus a total junction area average J is 1600 μm². The occupation areas of the protection diodes 21' to 24' are respectively 174 μm×174 μm. The occupation area of the protection diode group 2 is 351 μm×351 μm.

By contrast, the occupation area of a protection diode 32 which is formed according to the design values shown in FIG. 10B to have the same junction average (1600 μm²) is 603 μm×603 μm. Thus, according to this embodiment, the occupation area can be reduced by 79%.

Figure 11:
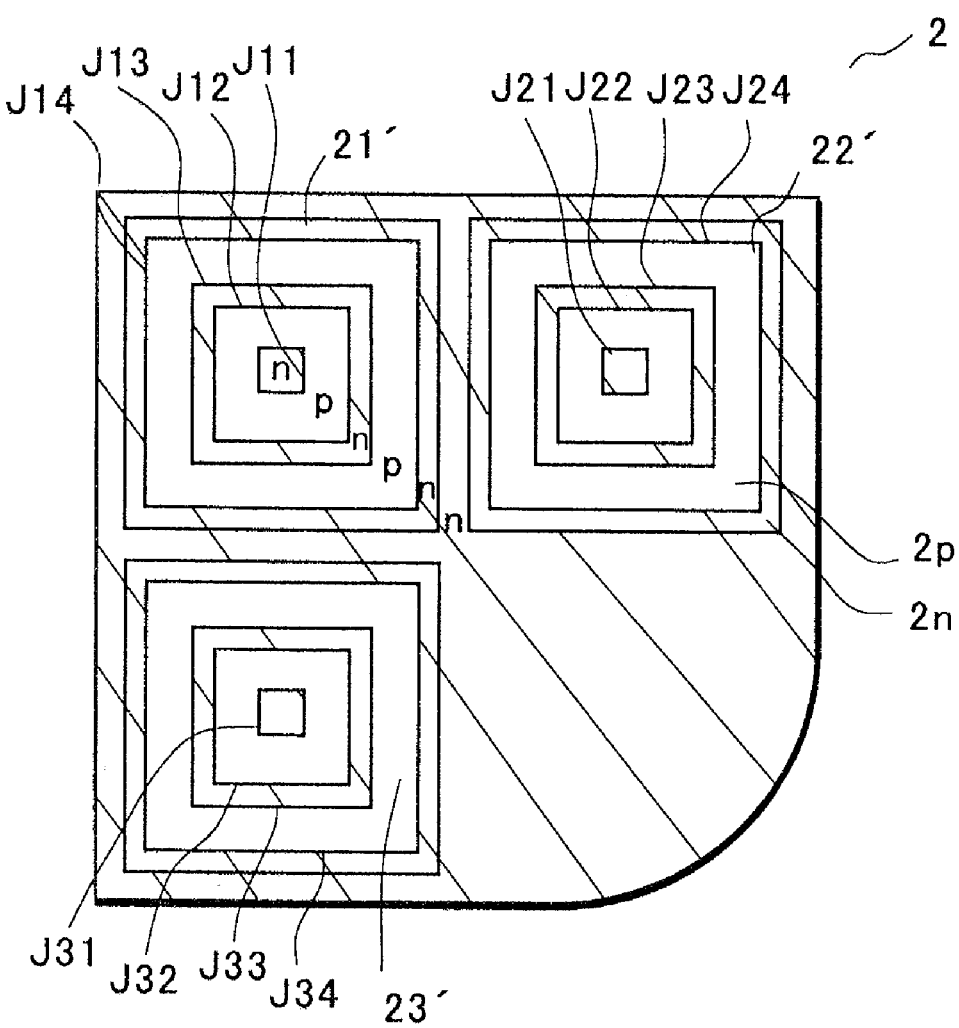
FIG. 11 is a plan view for describing a third preferred embodiment of the invention.

A third embodiment of the present invention will be described with reference to FIG. 11. FIG. 11 is a plan view showing a protection diode group 2 of the third embodiment. When a gate pad electrode is disposed, for example, at a corner of a chip, one corner of the gate pad electrode is cut so that the gate pad electrode has a sector form, and a single protection diode 24' of FIG. 9A is eliminated according to the shape of the gate pad electrode. As long as a necessary ESD tolerance is guaranteed in this manner, the number of protection diodes in the protection diode group is not limited to four. Moreover, it is possible to utilize the region of the gate pad electrode where no protection diode is formed as an operating region on which transistor cells are disposed.

Figure 12:
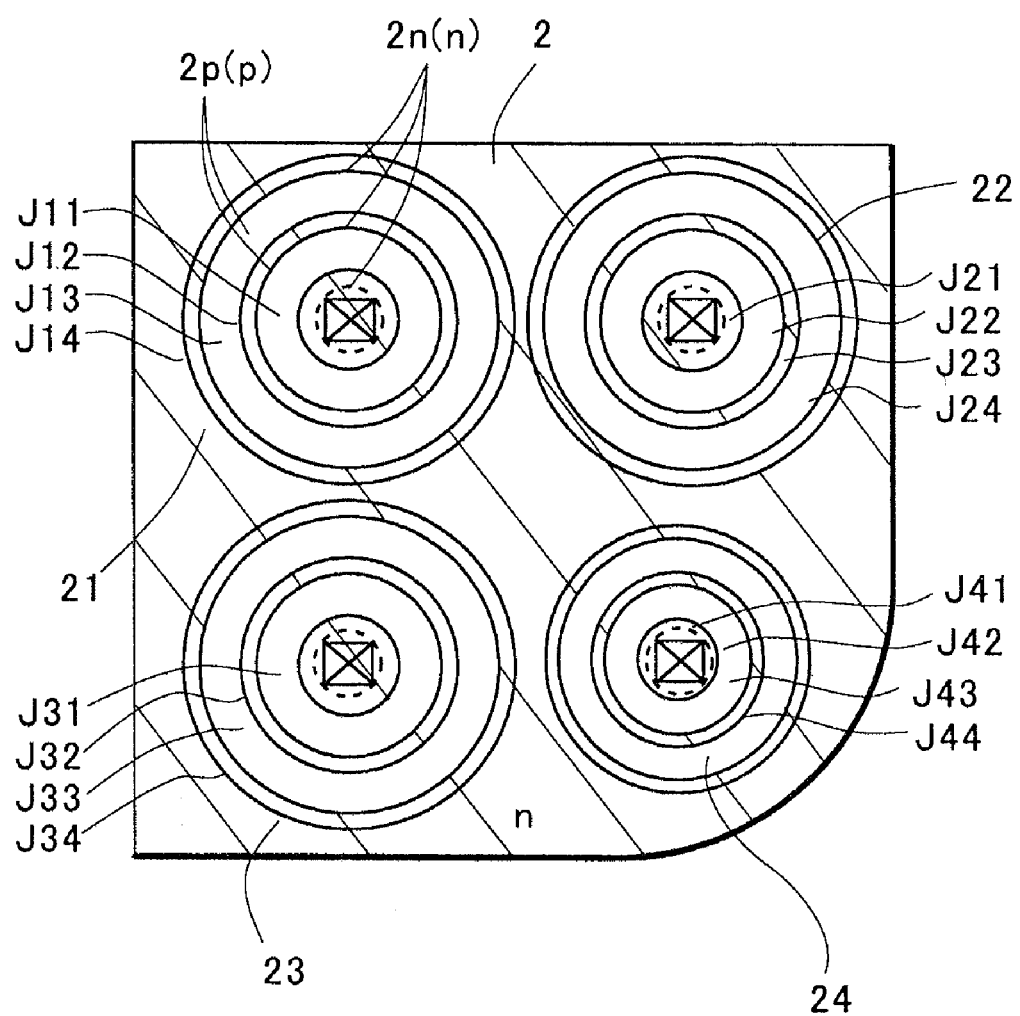
FIG. 12 is a plan view for describing a fourth preferred embodiment of the invention.

A fourth embodiment of the present invention will be described with reference to FIG. 12. FIG. 12 is a plan view showing a protection diode group 2 of the fourth embodiment. As similar to FIG. 11, when a gate pad electrode 1 is disposed, for example, at a corner of a chip, one corner of the gate pad electrode 1 is cut so that the gate pad electrode has a sector form. Accordingly, the size of a single protection diode 24 as shown in FIG. 2A is made smaller than those of protection diodes 21, 22, 23 according to the shape of the gate pad electrode, while the shape itself of the single protection diode 24 is kept the same. As long as a desired breakdown voltage is guaranteed in this manner, the widths of n type semiconductor regions 2n and p type semiconductor regions 2p of the protection diode 24 may be different from those of the protection diodes 21 to 23. Moreover, it is possible to reduce the area of the n type semiconductor region 2n that is located in the center of the protection diode 24 and that comes into contact with the gate pad electrode 1 and to make the widths of the other n type semiconductor regions 2n and the p type semiconductor regions 2p the same as those of the protection diodes 21, 22, 23. Thereby, the ESD tolerance can be effectively guaranteed as compared with the case where the number of protection diodes is reduced as shown in FIG. 11.

Figure 13:
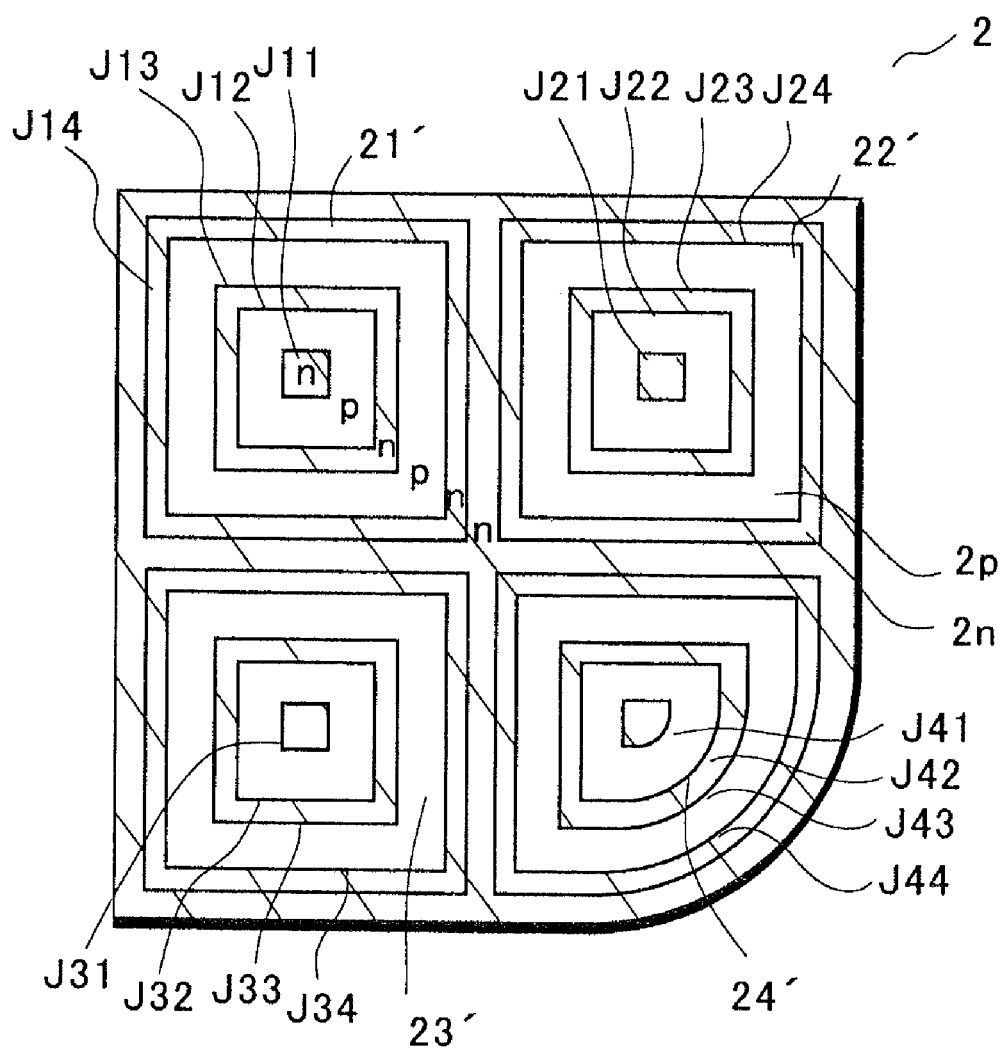
FIG. 13 is a plan view for describing a fifth preferred embodiment of the invention.

A fifth embodiment of the present invention will be described with reference to FIG. 13. FIG. 13 is a plan view showing a protection diode group 2 of the fifth embodiment. As similar to FIG. 11, when a gate pad electrode is disposed, for example, at a corner of a chip, one corner of the gate pad electrode is cut so that the gate pad electrode has a sector form. Accordingly, a single protection diode 24' as shown in FIG. 9A is deformed according to the shape of the gate pad electrode, and n type semiconductor regions 2n and p type semiconductor regions 2p are disposed in a concentric form. The shape of each protection diode of the protection diode group 2 may be changed in this manner, and thus the ESD tolerance can be more effectively guaranteed as compared with the case of FIG. 12.

Figure 14:
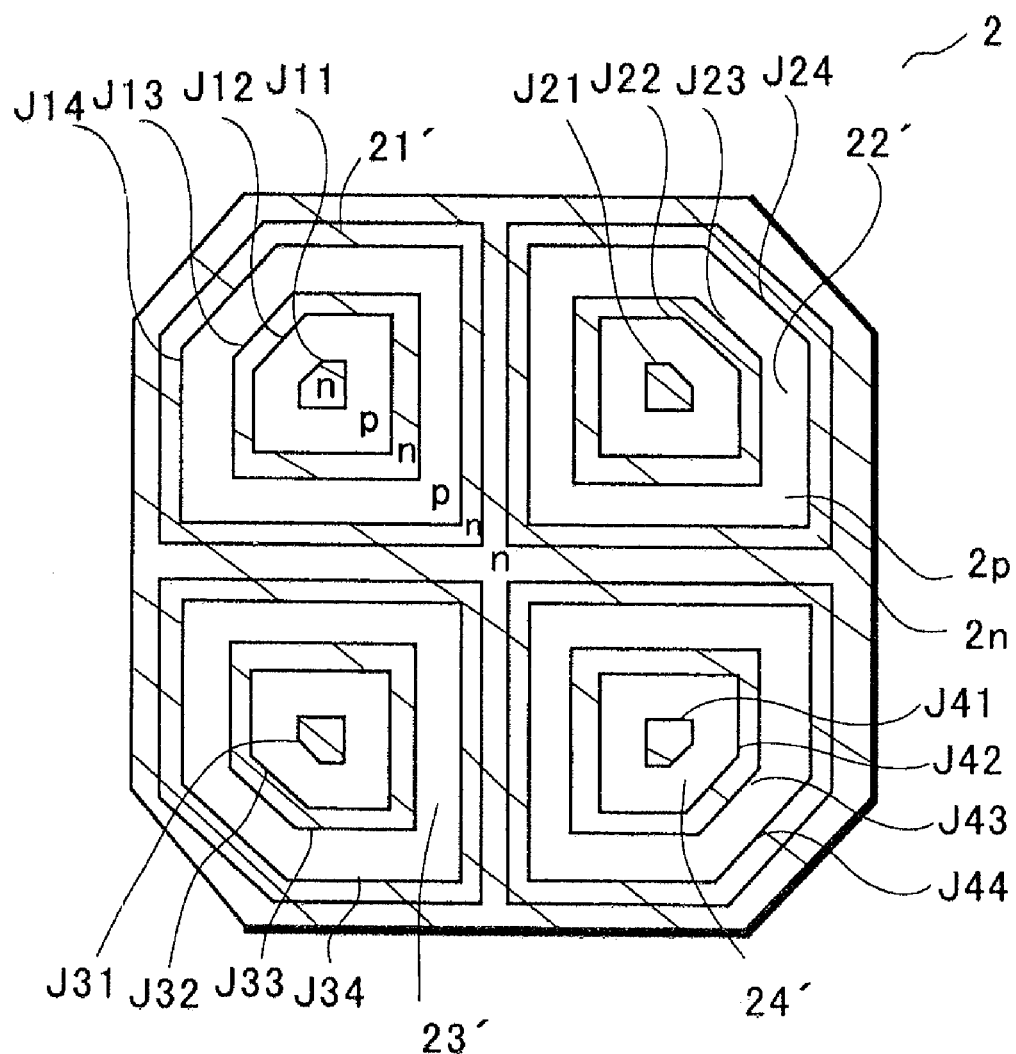
FIG. 14 is a plan view for describing a sixth preferred embodiment of the invention.

A sixth embodiment of the present invention will be described with reference to FIG. 14. FIG. 14 is a plan view showing a protection diode group 2 of the sixth embodiment. When a gate pad electrode is, for example, octagon-shaped, pn junction interfaces of protection diodes may be formed in a shape shown in FIG. 14 other than an annular portion or rectangular shape according to the shape of the gate pad electrode, and n type semiconductor regions 2n and p type semiconductor regions 2p may be disposed in a concentric form. Thereby, the ESD tolerance can be effectively guaranteed while utilizing the shape of the gate pad electrode to the maximum. Moreover, it is possible to select the shape of the protection diode appropriately regardless of the shape of the gate pad electrode.

Figure 15:
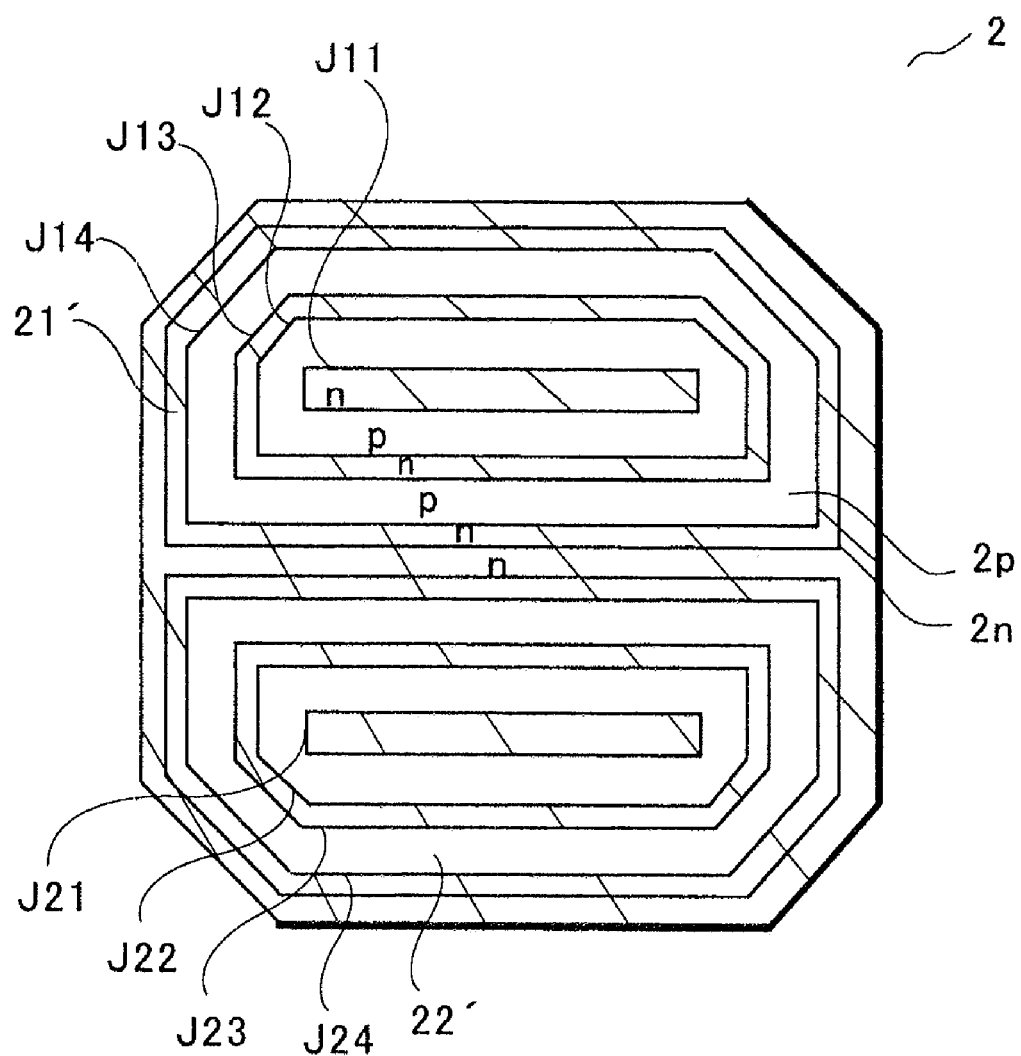
FIG. 15 is a plan view for describing a seventh preferred embodiment of the invention.

A seventh embodiment of the present invention will be described with reference to FIG. 15. FIG. 15 is a plan view showing a protection diode group 2 of the seventh embodiment. The number of protection diodes that constitute the protection diode group 2 is not limited to four, and may be two as shown in FIG. 15, three as shown in FIG. 11, or any other number. It is possible to select the number of protection diodes appropriately according to the size of the gate pad electrode, necessary ESD tolerance, or breakdown voltage.

Figure 16:
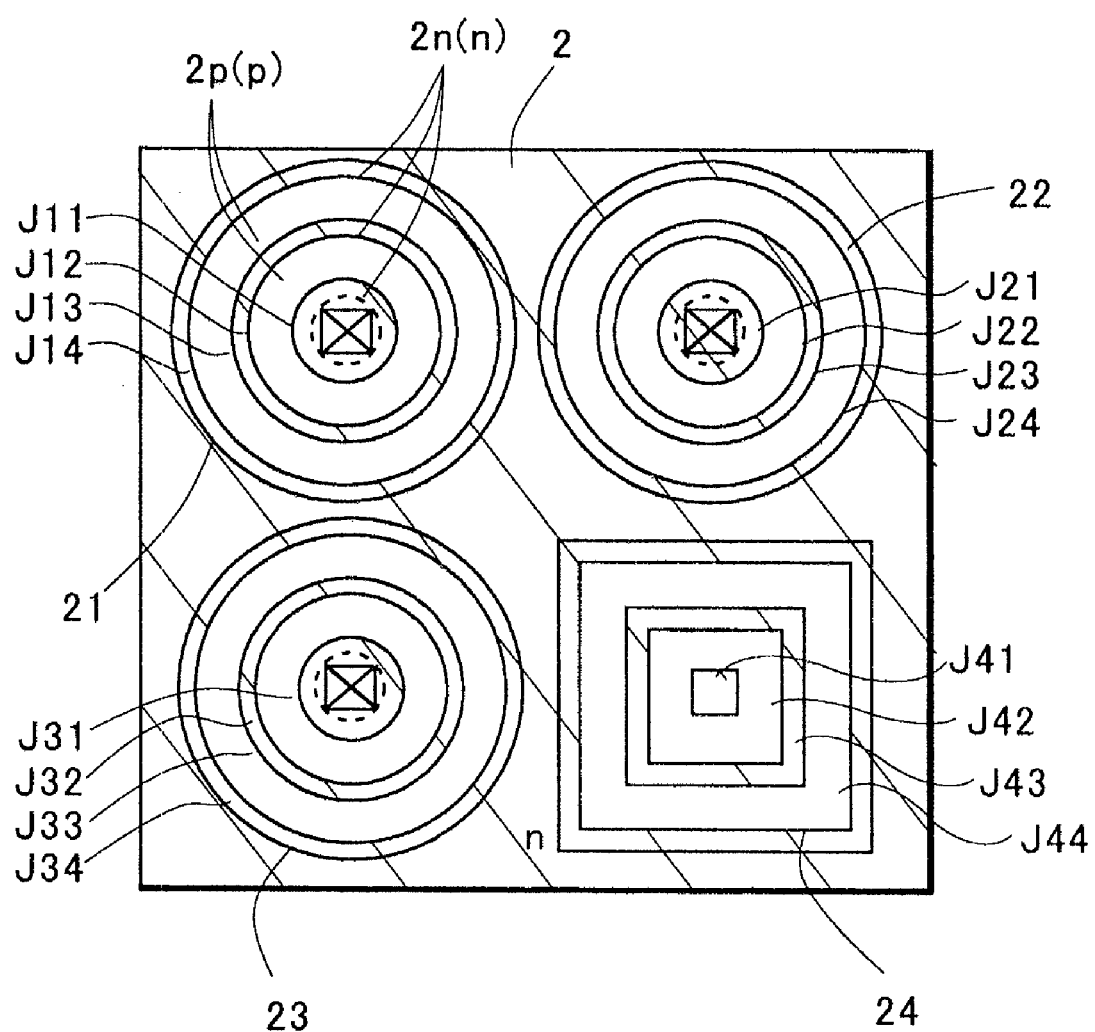
FIG. 16 is a plan view for describing an eighth preferred embodiment of the invention.

An eighth embodiment of the present invention will be described with reference to FIG. 16. FIG. 16 is a plan view showing a protection diode group 2 of the eighth embodiment. A single protection diode 24 as shown in FIG. 2 is deformed into a rectangular shape, and n type semiconductor regions 2n and p type semiconductor regions 2p are disposed in a concentric form. The shape of each protection diode of the protection diode group may be changed in this manner. Although the gate pad electrode is rectangular in FIG. 16, this embodiment is effective when it is necessary to change the shape of each protection diode of the protection diode group 2 according to the shape of the gate pad electrode.

Figure 17:
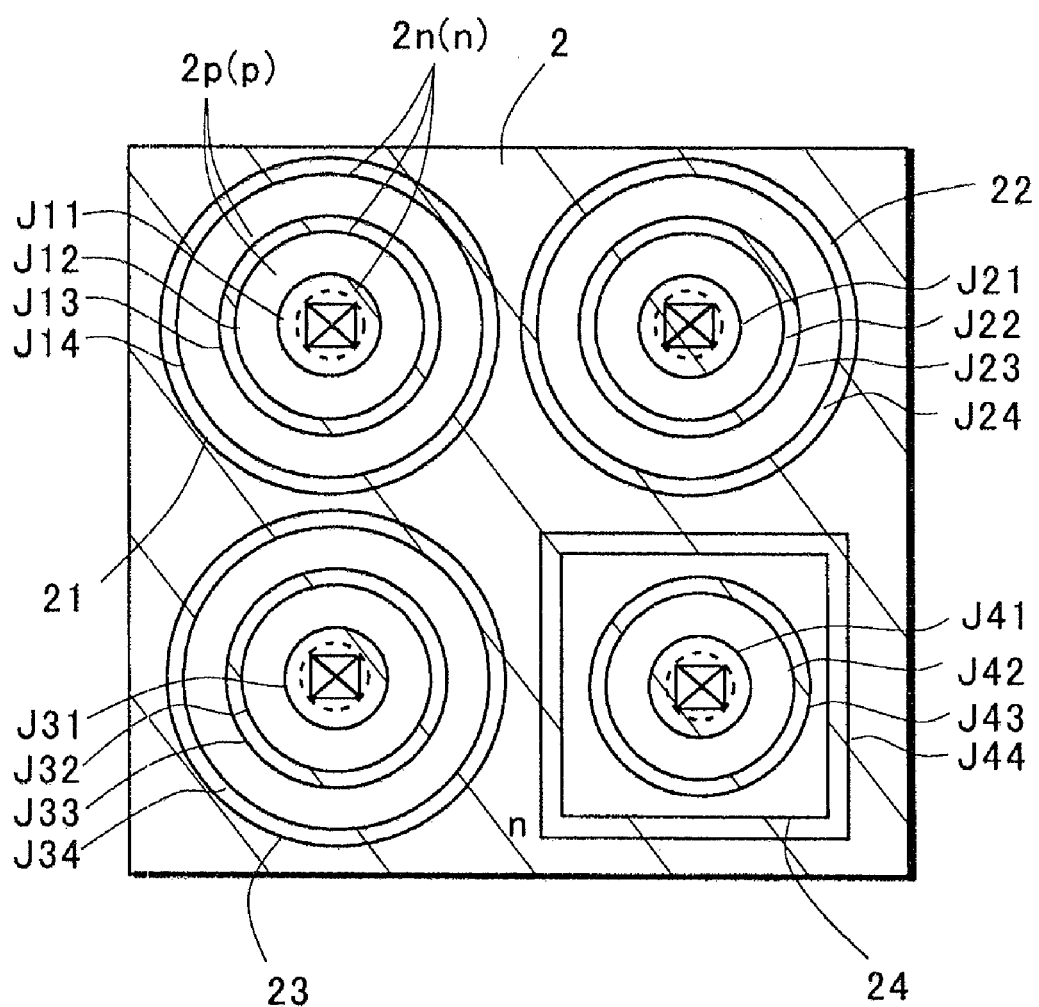
FIG. 17 is a plan view for describing a ninth preferred embodiment of the invention.

A ninth embodiment of the present invention will be described with reference to FIG. 17. FIG. 17 is a plan view showing a protection diode group 2 of the ninth embodiment. A single protection diode 24 as shown in FIG. 2 is deformed, and the protection diode 24 does not have a concentric form (but has a combination of pn junction interfaces that are not similar to each other). As long as a desired breakdown voltage is guaranteed, it is not necessary to make the widths of n type semiconductor regions 2n and p type semiconductor regions 2p the same in the protection diode 24. It is only necessary to guarantee the minimum required width.

Figure 18A:
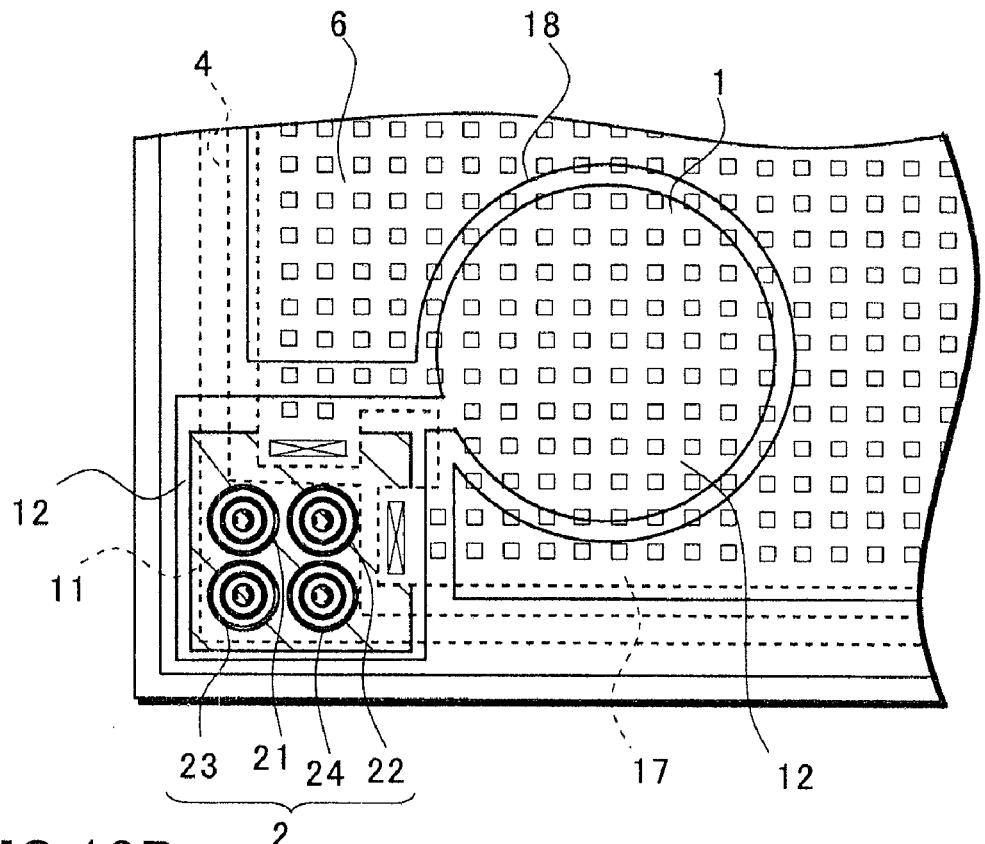
FIGS. 18A and 18B are plan views for describing a tenth preferred embodiment of the invention.
Figure 18B:
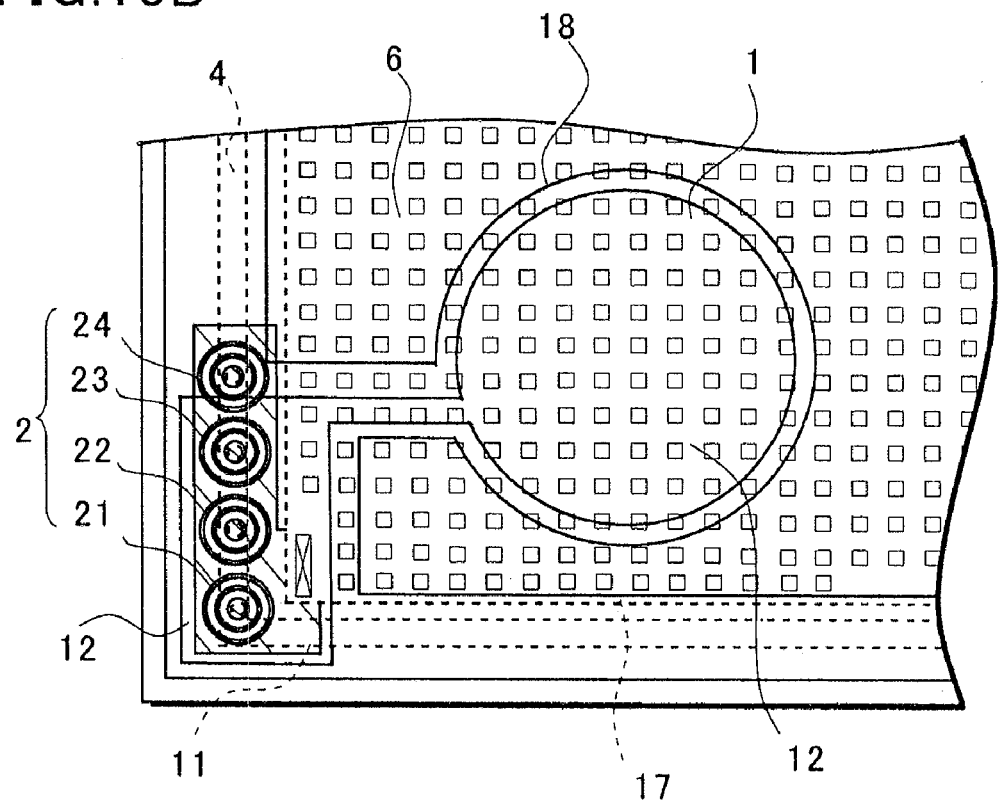

A tenth embodiment of the present invention will be described with reference to FIGS. 18A and 18B. FIGS. 18A and 18B are plan views for describing the tenth embodiment. In the first embodiment, the description has been given of the case where the protection diode group 2 is disposed under the gate pad electrode 1, that is, the gate pad electrode 1 is superposed on the protection diode group 2. However, the gate pad electrode 1 does not have to completely be superposed on the protection diode group 2.

FIG. 18A is a plan view when a gate pad electrode 1 is not superposed on a protection diode group 2. In FIG. 18A, the gate pad electrode 1 is a metal layer having substantially a circular shape, and is disposed on an operating region 5.

For example, when a bump electrode (unillustrated) having a diameter of approximately 300 μm is fixed to the gate pad electrode 1, the gate pad electrode 1 needs to be made larger according to the diameter of the bump electrode. Meanwhile, the arrangement of the bump electrode may be restricted due to the pattern of an external wiring board or the like in some cases. The gate pad electrode 1 also has a problem that the gate pad electrode 1 cannot be disposed at any position on a chip. In such cases, the protection diode group 2 should be disposed so that at least a part of the gate pad electrode 1 may not be superposed on the protection diode group 2.

Specifically, each of a gate electrode layer and a source electrode layer has a two-layer structure. A first layer of a first gate electrode layer 11 indicated by a dashed line is connected to the protection diode group 2, forming a gate connection electrode 4. A part (in FIG. 18A, substantially a rectangular region which is located above the protection diode group 2 and which is superposed on the protection diode group 2) of a second layer of a second gate electrode layer 12 indicated by a solid line is also superposed on the first gate electrode layer 11 and comes into contact therewith, while a part of the second gate electrode layer 12 which is not superposed on the protection diode group 2 constitutes the gate pad electrode 1.

Meanwhile, a first layer of a first source electrode layer 17 indicated by a dashed line comes into contact with a source region of a MOS transistor cell 6 while covering the operating region 5. A second layer of a second source electrode layer 18 indicated by a solid line is provided on the operating region 5 so as to surround the gate pad electrode 1 except for the formation region of the second gate electrode layer 12. The second source electrode layer 18 comes into contact with the first source electrode layer 17. In this case, an insulating film is disposed on a region where the first source electrode layer 17 and the second gate electrode layer 12 superpose.

Thereby, even in a case, for example, where the gate pad electrode 1 cannot be disposed in a corner portion of the chip, the protection diode group 2 can be disposed on a region in which the protection diode group 2 is less likely to disturb uniform arrangement of the MOS transistor cells 6, such as the corner portion of the chip, or a so-called invalid region where no MOS transistor cell 6 is disposed. Furthermore, in this embodiment, the area of the protection diode group 2 is reduced while the performance equal to that of the conventional structure is retained. Thus, the operating region 5 can be utilized effectively regardless of the position of the gate pad electrode 1.

FIG. 18B shows one example of a case where the protection diode group 2 has a shape different from that shown in FIG. 18A. The arrangement of the protection diode group 2 formed of; for example, four protection diodes 21, 22, 23, 24 is not limited to a matrix pattern of 2 rows×2 columns as shown in FIG. 18A. The protection diode group 2 may be arranged in a pattern of 4 rows×1 column (1 row×4 columns) as shown in FIG. 18B or in an L-shaped pattern, utilizing the corner portion of the chip.

Furthermore, although unillustrated, by forming the gate electrode and the source electrode in the two-layer structure as shown in FIG. 18A, it is possible to superpose the gate pad electrode 1 on a part of the protection diode group 2.

An eleventh embodiment of the present invention will be described with reference to FIG. 19. In the eleventh embodiment, outermost n type semiconductor regions 2n (or p type semiconductor regions 2p) of multiple protection diodes constituting a protection diode group 2 are arranged apart from each other.

When restriction is imposed on the arrangement region of the protection diode group 2 on a chip due to the reduction in the chip size, the restriction on the position of a gate pad electrode 1, or the like, the protection diode group 2 can be divided for the arrangement.

Figure 19:
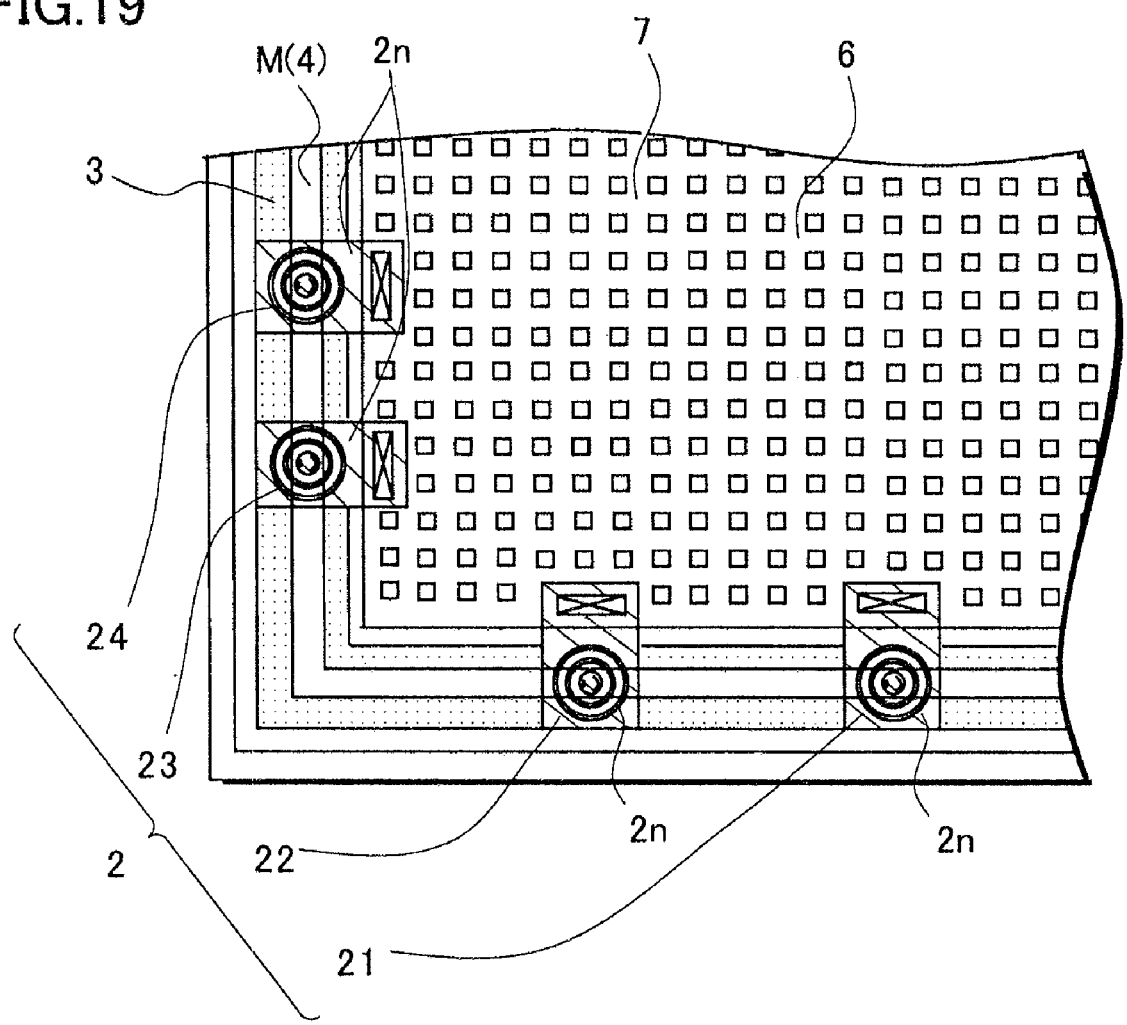
FIG. 19 a plan view for describing an eleventh preferred embodiment of the invention.

As shown in FIG. 19, a gate extraction part 3 is provided under a gate connection electrode 4. The gate extraction part 3 is formed of a conductive layer (for example, a polysilicon layer having impurities implanted therein) which surrounds an operating region 5, and on which the gate connection electrode 4 is superposed partially. Note that, although unillustrated, the gate extraction part 3 is provided under the gate connection electrode 4 in FIGS. 1 to 18B, as well. The gate extraction part 3 connects a gate electrode of a MOS transistor cell 6 and the gate connection electrode 4. The gate connection electrode 4 is connected to the unillustrated gate pad electrode 1.

In the eleventh embodiment, the protection diodes 21 to 24 are provided in the polysilicon layer of the gate extraction part 3. The protection diodes 21 to 24 do not share the outermost (here) n type semiconductor regions 2n, and are arranged so that the outermost n type semiconductor regions 2n can be apart from each other.

Moreover, a metal layer M is extended over innermost n type semiconductor regions 2n of the four protection diodes 21 to 24 so as to come into contact therewith, connecting the protection diodes 21 to 24 to each other. As the metal layer M, for example, the gate connection electrode 4 can be utilized. Furthermore, the outermost n type impurity regions 2n of the protection diodes 21 to 24 come into contact with a source electrode 7.

In this way, the protection diode group 2 formed of the four protection diodes 21 to 24 is parallel-connected between the source and the gate of the MOSFET. Since the protection diodes 21 to 24 each have a diameter of only, for example, 213 μm, the protection diode group 2 can be arranged utilizing a narrow invalid region (region where the MOS transistor cell 6 cannot be disposed) on the chip.

Although FIG. 19 exemplifies the case where the protection diodes 21 to 24 are arranged so as to be completely superposed on the gate extraction part 3, this embodiment is not limited to this case. For example, when the gate extraction part 3 is narrower than the diameter of the protection diode 21 (also, 22 to 24), the polysilicon layer is patterned so as to project from the gate extraction part 3 as shown in, for example, FIGS. 1, 18A and 18B, and then the protection diode 21 should be provided therein.

Moreover, although FIG. 19 exemplifies the case where the four protection diodes 21 to 24 are arranged apart from each other, this embodiment is not limited to this case. Specifically, it is only necessary that the protection diodes constituting the protection diode group 2 be connected to each other in parallel between the gate connection electrode 4 and the source electrode 7. For example, three of the protection diodes may share the outermost n type (p type) semiconductor regions, while the last one of the protection diodes may be apart from and connected in parallel to the three through the gate connection electrode 4 and the source electrode 7.

By the protection diodes 21 to 24 are separated, the freedom of arranging the protection diode group 2 is further improved.

Furthermore, although FIG. 19 exemplifies the case where the source electrode 7 is formed of a single layer, the source electrode layer and the gate electrode layer may each have a two-layer structure as shown in FIGS. 18A and 18B. In this case, for example, a first gate electrode layer 11 can be utilized as the metal layer M, and a first source electrode layer 17 can be utilized as the source electrode 7.

In the tenth and eleventh embodiments, each pn junction interface of the protection diode group 2 may be formed into a rectangular shape as shown in FIG. 9A. Still furthermore, it is not necessary that all of the protection diodes 21 to 24 have the identical sizes as in the fourth embodiment (FIG. 12). The patterns of the fifth embodiment (FIG. 13), sixth embodiment (FIG. 14), seventh embodiment (FIG. 15), eighth embodiment (FIG. 16), and ninth embodiment (FIG. 17) may be adopted.

In any embodiment, each of the protection diodes 21 to 24 is arranged so as to have no end surfaces (side end surfaces) exposed to the outside of the diode. In other words, it is desirable to concentrically arrange the pn junction interfaces in a closed form, so that the end surfaces (side end surfaces) are not exposed, whereby a leak current is prevented.

Hereinabove, in the present embodiments, the description has been given of, as an example, the case where the insulated gate semiconductor element formed in the operating region is the MOSFET. However, the preferred embodiments are not limited to this, and can be carried out even in a case of other types of insulated gate semiconductor element, for example, an insulated gate bipolar transistor (IGBT) and the like. The same effects can still be obtained.

According to the present embodiments, it is possible to provide a protection diode group which has a smaller area than a conventional protection diode, but which surely guarantees a desirable ESD tolerance and still has characteristics, such as a breakdown voltage and leak current, equal to those of the conventional protection diode.

Specifically, the protection diode group of the present embodiments is not formed of a conventional single protection diode but is formed of multiple (for example, four) protection diodes obtained by dividing such a conventional single protection diode. The four protection diodes each having a concentric form are connected to each other in parallel and disposed under a single gate pad electrode. For the purpose of guaranteeing a desired ESD tolerance, the value is calculated as follows is used. Specifically, the value is obtained by summing the junction areas of the protection diodes for each of the pn junction interfaces in the innermost to outermost concentric annular portions, and then by calculating an average value of the summed junction areas of the respective pn junctions. The value thus obtained is set large enough to obtain the desired ESD.

Accordingly, when the ESD tolerance equal to a conventional ESD tolerance (average value of junction areas of conventional pn junctions) is obtained according to the embodiments, the occupation area of the protection diode group on a chip is reduced.

Moreover, the formation conditions of p type and n type semiconductor regions that constitute the protection diodes are the same as conventional formation conditions. Thus, while other characteristics, such as a breakdown voltage and leak current, of the protection diodes are retained, the occupation area of the protection diode group is reduced.

For example, when the ESD tolerance of 1000 V for a machine model is guaranteed, the area of the protection diode group can be $1.84\text{E}+5$ μm$^2$. This is 68% reduction from the area ($5.76\text{E}+5$ μm$^2$) of a protection diode having a conventional structure and the same characteristics.

What is claimed is:

1. An insulated gate semiconductor device comprising:
a semiconductor substrate;
a plurality of transistor cells of an insulated gate semiconductor element formed in the semiconductor substrate so as to define an operating region in the semiconductor substrate;
a gate pad electrode disposed on the semiconductor substrate and connected to gate electrodes of the transistor cells; and
a group of protection diodes disposed on the semiconductor substrate outside the operating region,
wherein the group of protection diodes comprises a first protection diode and a second protection diode that are connected to each other in parallel,
the first protection diode has a plurality of pn junctions that are formed between a p type semiconductor region and an n type semiconductor region and are concentric closed-loops having a first center, and
the second protection diode has a plurality of pn junctions that are formed between a p type semiconductor region and an n type semiconductor region and are concentric closed-loops having a second center different from the first center.

2. The insulated gate semiconductor device of claim 1, wherein the group of protection diodes is disposed under the gate pad electrode.

3. The insulated gate semiconductor device of claim 1, further comprising a conductive layer disposed around the operating region, wherein the first and second protection diodes comprise part of the conductive layer.

4. The insulated gate semiconductor device of claim 1, wherein the group of protection diodes has protection diodes of a total number M,
each of the M protection diodes has pn junctions of a total number N, and
a total junction area average of the group is determined so as to guarantee a predetermined desired electrostatic discharge tolerance, where the total junction area average is calculated by summing up all junction areas for all M×N pn junctions and dividing the sum by N.

5. The insulated gate semiconductor device of claim 4, wherein the first and second protection diodes have an identical shape.

6. The insulated gate semiconductor device of claim 5, wherein the identical shape is a rectangular shape.

7. The insulated gate semiconductor device of claim 5, wherein the identical shape is a circular shape.

8. The insulated gate semiconductor device of claim 6, wherein a total number of the protection diodes in the group of protection diodes is four.

9. The insulated gate semiconductor device of claim 1, wherein an outermost semiconductor region of the first protection diode is continuous with an outermost semiconductor region of the second protection diode.

10. The insulated gate semiconductor device of claim 1, wherein an outermost semiconductor region of the first protection diode is connected to an outermost semiconductor region of the second protection diode with a metal layer.

* * * * *